United States Patent [19]

Fujii et al.

[11] Patent Number: 4,834,910

[45] Date of Patent: May 30, 1989

[54] COATING AGENT FOR IMPARTING ELECTROCONDUCTIVITY

[75] Inventors: Masaki Fujii; Tatsuo Wakayama, both of Yokkaichi, Japan

[73] Assignee: Mitsubishi Petrochemical Co., Ltc., Tokyo, Japan

[21] Appl. No.: 118,397

[22] Filed: Nov. 6, 1987

[30] Foreign Application Priority Data

Nov. 19, 1986 [JP] Japan ................................ 61-273855

[51] Int. Cl.$^4$ ............................................... H01B 1/06
[52] U.S. Cl. .................................... 252/511; 252/510; 252/502
[58] Field of Search ....................... 252/502, 510, 511; 524/186, 495, 496

[56] References Cited

U.S. PATENT DOCUMENTS

| | | | |
|---|---|---|---|
| 4,680,140 | 7/1987 | Kageyama | 252/511 |
| 4,705,646 | 11/1987 | DuPont et al. | 252/511 |
| 4,714,569 | 12/1987 | Nishino et al. | 252/511 |
| 4,717,595 | 1/1988 | Watanabe et al. | 427/221 |

Primary Examiner—Josephine Barr
Attorney, Agent, or Firm—Frishauf, Holtz, Goodman & Woodward

[57] ABSTRACT

There is disclosed a coating agent for imparting electroconductivity which comprises electroconductive carbon black dispersed in a hydrophilic solution of a maleic acid copolymer subjected to treatment for imparting hydrophilic property by use of a basic substance.

By applying the coating agent for imparting electroconductivity of the present invention to a substrate, particularly a paper, a high level of electroconductivity can be given without imparting air permeability or liquid absorbing characteristic.

16 Claims, No Drawings

COATING AGENT FOR IMPARTING ELECTROCONDUCTIVITY

BACKGROUND OF THE INVENTION

This invention relates to a coating agent for imparting electroconductivity to an insulator, more particularly to a coating agent for imparting electroconductivity, comprising carbon black dispersed in a hydrophilic solution of a maleic acid copolymer.

With development of electronic industries, it has been demanded to prevent static charges or shield electromagnetic waves against casing, housing box, package, etc. of electronic parts or electrical instruments, and it is becoming important to impart electroconductivity for this purpose.

In the prior art, for imparting electroconductivity to a housing box of electronic parts, it has been practiced to mold the box with, for example, a material having electroconductivity imparted thereto such as a thermoplastic resin kneaded with carbon black (Japanese Provisional Patent Publication No. 152736/1980). However, the material having electroconductivity imparted thereto becomes generally expensive, and yet also has problems in physical properties, and therefore, its use has been of itself limited. Also, it is known to apply an electroconductive coating material on a casing, etc. formed of an insulating material, but the electroconductive coating material has the problems such that it has not sufficient conductivity or that adhesion with the substrate is not sufficient, etc. Particularly, when the electroconductive coating material is applied onto paper, wood, etc. to impart electroconductivity thereto, although the surface resistance can be lowered, it was still insufficient in the point to lower the electrical resistance value between the front and the rear by penetration into the inner portion of such material.

SUMMARY OF THE INVENTION

The present invention has been accomplished in order to avoid the drawbacks of the prior art as described above. To this end, the present invention provides a means to impart high electroconductivity by coating of an insulating material. This makes it possible to impart electroconductivity by coating of paper, wood, etc., to be used for electrical instruments, electronic parts, etc., thereby imparting static charge prevention, electromagnetic wave shielding or magnetic field shielding function, or to use such materials as the electroconductive material by impregnation of an insulating material such as paper, cloth, etc.

The present invention thus provides a coating agent for imparting electroconductivity, comprising electroconductive carbon black dispersed in a hydrophilic solution of a maleic acid copolymer subjected to treatment for imparting hydrophilic property by use of a basic substance.

DESCRIPTION OF THE PREFERRED EMBODIMENTS

As the maleic acid copolymer which is starting material for the maleic acid copolymer to be subjected to treatment for imparting hydrophilic property to be used in the coating agent of the present invention, there may be employed those obtained by copolymerization of maleic anhydride with one or more of α-olefins and vinyl compounds, and those which were further formed into derivatives. Examples of the α-olefin to be used in the copolymerization reaction may include ethylene, propylene, isobutylene, 1,2-butadiene, etc. As finyl compound, there may be employed alkenyl aromatic compounds such as styrene, α-methylstyrene, alkyl-nucleus-substituted styrene, etc.; vinyl acetate, vinyl chloride, methyl vinyl ether, or (meth)acrylates such as methyl (meth)acrylate, ethyl (meth)acrylate, butyl (meth)acrylate, (meth)acrylonitrile, etc.

The method for polymerization of these monomers with maleic anhydride is not particularly limited, but any polymerization method known in the art such as solution polymerization, bulk polymerization, emulsion polymerization, suspension polymerization, etc. can be employed.

The maleic acid content in the maleic acid copolymer may be generally 5 to 50 mole %, preferably 10 to 50 mole %, more preferably 20 to 50 mole %. Particularly, an alternate polymer of maleic acid with another comonomer is desirable.

The amount of α-olefin and/or a vinyl compound to be copolymerized with maleic anhydride may be 95 to 50 mole %, preferably 90 to 50 mole %, more preferably 80 to 50 mole %.

If α-olefin or vinyl compound exceed 95 mole %, solvent resistance is lowered, while when it is lower than 50 mole %, a copolymer with maleic anhydride can be obtained with difficulty.

The copolymer with maleic anhydride may preferably be have an average molecular weight (Mw) of 10,000 or more, more preferably 50,000 or more, and most preferably 100,000 or more. An upper limit of the molecular weight is not limited and higher molecular weight gives excellent physical properties after coating such as strength, solvent resistance, etc. However, if it exceeds 2,000,000, dispersion of carbon becomes difficult so that practical upper limit should be 2,000,000.

Also, the above copolymer can be formed into a half ester derivative obtained by the reaction with lower alcohols, and it is also possible to further neutralize this product with amines as described below before use.

The maleic acid copolymer thus obtained is endowed with hydrophilic property by treatment with a basic substance. The treatment for imparting hydrophilic property with a basic substance can be performed by addition of a basic substance after hydrolysis under the co-presence of an organic acid or by direct addition of a basic substance.

As the basic substance in the present invention, nitrogen containing basic compounds including alkylamines such as ammonia, trimethylamine, etc.; alkanolamines such as ethanolamine, etc.; water-soluble amines such as (poly)allylamine (poly)ethyleneimine, (poly)-vinylimidazole, etc. are preferred, and one or a mixture of two or more compounds can be used. Particularly, ammonia or a readily volatile amine is desirable.

Treatment of the maleic acid copolymer with a basic substance may be carried out by hydrolyzing the copolymer in the presence of aliphatic carboxylic acids such as formic acid, acetic acid, propionic acid, oxalic acid, etc. followed by neutralization with addition of a basic substance, or alternatively directly by hydrolysis and neutralization or acid amidation in the presence of the above amines.

An amount of the organic acid to be used may preferably be in the range of 0.1 to 1.0 in terms of molar ratio based on the maleic anhydride unit in the copolymer with maleic anhydride, more preferably in the range of 0.3 to 0.6. If the amount of the organic acid is less than 0.1, there are disadvantages that hydrolysis occurs insufficiently and water resistance is lowered. On the other hand, even if it is added excessively, any merits could not be expected.

Generally, the maleic acid copolymer formed into fine powder is dispersed in a hydrophilic solvent, and the above organic acid and basic substance are added to the dispersion and stirred at 0° to 100° C. for several minutes to several hours.

The amount of the basic substance added is made such that the pH of the hydrophilic solution after completion of the treatment may exhibit 3 to 13, preferably 4 to 12.5.

When an inorganic acid or a metal hydroxide is used as the acid or the basic substance to be used for the treatment for imparting hydrophilic property to the maleic acid copolymer, there is fear of corrosion, etc. of the substrate to be coated, and they are not desirable except for special purpose.

The maleic acid copolymer is converted to a copolymer soluble in a hydrophilic solvent accompanied with progress of hydrolysis, neutralization reaction, etc. with the acidic or basic substance, whereby dissolution proceeds.

When powdery copolymer disappears, or after stirring is further continued to effect aging, the treatment is completed.

An extent of the alkali treatment of the maleic acid copolymer, that is, an extent of saponification, may desirably be 30% being mono- or di-salt of the maleic acid unit in the maleic acid copolymer, more desirably 45% or more, and in particular use, 70% or more.

As the hydrophilic solvent, a single solvent or a solvent mixture of two or more kinds such as water, alcohols, cellosolves, furanol, dioxane, etc. can be used.

Into a hydrophilic solution of the maleic acid copolymer subjected to treatment for imparting hydrophilic property thus obtained, electroconductive carbon black is further added to have carbon black dispersed into the hydrophilic solution to give the coating agent of the present invention.

The carbon black to be used in the present invention is electroconductive carbon, as exemplified specifically by Acetylene Black, Ketchen Black (trade name, produced by AKZO Co.), Furnace Black, etc.

The above carbon black may preferably have a DBP (dibutylphthalate) oil absorption number of 150 to 500 ml/100 g carbon and have a specific surface area of 40 to 1,500 m²/g.

The ratio of the carbon black to the maleic acid copolymer subjected to treatment for imparting hydrophilic property may be 0.1 to 10 parts by weight, preferably about 0.5 to 5 parts by weight per 1 part by weight of carbon black.

The solid content in the hydrophilic solution may be within the range from 1 to 50% by weight, preferably from 5 to 45% by weight.

The coating agent may be suitably diluted before use.

As the dispersing aid, various surfactants (preferably nonionic type: polyoxyethylene nonylphenyl ether, etc.) may be used, if desired, but no such material should preferably by used so far as possible from the standpoint of imparting electroconductivity.

The coating agent thus obtained can impart electroconductivity to paper, wood, etc. by coating and impregnating paper, wood, etc. with the agent by brush coating, spraying, dipping, etc. By use of electroconductive paper, wood, etc., electronic parts, shielding parts packages, housing vessels, etc. can be manufactured.

When ammonia or a readily volatile amine is used as the basic substance, the solubility of the maleic acid copolymer is improved by treatment with a basic substance, whereby coating and impregnation will become easier and by heating at 120° C. to 250° C. by means of rolls, etc. after coating, the substance will be volatilized to lower the solubility of the maleic acid copolymer. Accordingly, the coating film after heating will be dissolved in less amount into a polar solvent to improve solvent resistance against polar solvents.

Also, by coating electronic parts packaged in paper, wood, etc., with the coating agent of the present invention, the armoring material can be made electroconductive.

EXAMPLES

EXAMPLE 1

The present invention is described in more detail below by referring to the following Examples, by which the present invention is not limited at all.

An amount of 30 g of Printex L6 (particle size: 23 nm) which is highly electroconductive carbon black according to the Farnel process produced by Degussa Co., 6 g of a hydrolyzate (pH≈7) of a maleic anhydride-styrene alternate copolymer (molecular weight: 1,000,000) with ammonia water and 150 ml of pure water were treated in a ball mill made of a stainless steel (pot: inner diameter 9 cm×depth 13 cm; ball: diameter 13 mm×150 balls) at 150 rpm for 8 hours to have carbon black dispersed. The dispersion obtained by diluting this product with 150 ml of pure water was applied on a glass plate, dried naturally to form a coating with a thickness of 15 μm. The coating had an inherent conductivity of 3.4 Scm$^{-1}$. Also, in this dispersion, tissue paper (thickness≈4 μm) was dipped and dried naturally to give a weight gain of 25%, and the apparent inherent conductivity disregarding the voids between the cellulose fibers was 0.9 Scm$^{-1}$.

EXAMPLE 2

A dispersion was prepared under the same conditions as in Example 1 except for changing Printex L6 to acetylene black and the amount of the pure water for dilution to 450 ml.

The coating of 10 μm obtained by coating on a glass plate had an inherent conductivity of 2.6 Scm$^{-1}$, and the tissue paper dipped and dried had a weight gain of 29%, with the apparent inherent conductivity being 0.45 Scm$^{-1}$.

EXAMPLE 3

A dispersion was prepared under the same conditions as in Example 1 except for using Ketchen Black produced by Ketchen Black International Co. in place of Printex L6, changing the amount of the pure water for dilution to 350 ml and further adding 5 g of butyl cellosolve. The coating with a thickness of 10 μm obtained by coating on a glass plate had an inherent conductivity of 10 Scm$^{-1}$, and the tissue paper dipped and dried had a weight gain of 18%, with the apparent inherent conductivity being 1.3 Scm$^{-1}$.

By applying the coating agent for imparting electroconductivity of the present invention to a substrate, particularly a paper, high level of electroconductivity can be given without imparting air permeability or liquid absorbing characteristic. Besides, since no metal ion or conjugated base of inorganic acid is contained, undesirable reaction such as corrosion, etc. will not occur between the coating agent and the substrate when applied on various substrates.

EXAMPLE 4

As to the tissue paper which had been conductive treatment obtained in Example 1, the following evaluation was carried our in order to confirm the solubility of the polymer.

In a conical flask equipped with a ground stopper and charged therein diethylene glycol, γ-butyrolactone and dimethylformamide were dipped short strips (5 cm × 10 cm) of the above conductive treated tissue paper and allowed to stand at 100° C. for a week. As the result, there was no dissolution of the conductive materials and the solvent was colorless.

For comparison, a conductive agent obtained by without carrying out ammonia neutralization treatment, and that obtained by not adding acetic acid were employed for treating agents of tissue paper. By using tissue papers treated by the above conductive agents in the same manner as mentioned above, the same operation as the above was carried out to each samples. As the results, while conductivities thereof before experiment were the same as that obtained in Example 1, there occurred dissolution of the conductive agents after 1 hour of the solvent treatment in both samples so that the solvents became black color, respectively.

We claim:

1. A coating agent for imparting electroconductivity, comprising a maleic acid copolymer composed of 5 to 50 mole % of maleic acid and 95 to 50 mole % of at least one member selected from the group consisting of alpha-olefin and vinyl compound, dissolved in a hydrophilic solvent and subjected to treatment with a basic substance which is at least one selected from the group consisting of (i) ammonia, (ii) a readily volatile alkylamine, and (iii) a readily volatile alkanolamine to impart hydrophilic property thereto, the basic substance being used in an amount such that a pH of the solution after completion of the treatment is 4 to 12.5 and,
   an electroconductive carbon black dispersed in said coating agent, the solid component of the agent is 1 to 50% by weight and the ratio of the maleic acid copolymer to the carbon black is 0.1 to 10 parts by weight maleic acid copolymer per 1 part by weight of carbon black.

2. The coating agent according to claim 1, wherein the maleic acid copolymer is a copolymer of maleic anhydride and an alkenyl aromatic compound selected from the group consisting of styrene, alpha-methylstyrene and alkyl-nucleus substituted styrene.

3. The coating agent according to claim 1, wherein the maleic acid copolymer is a copolymer of 10 to 50 mole % of maleic anhydride and 90 to 50 % of alpha-methylstyrene.

4. The coating agent according to claim 1, wherein the maleic acid copolymer is a copolymer of maleic anhydride and styrene or a copolymer of maleic anhydride, styrene and alpha-methylstyrene.

5. The coating agent according to claim 1, wherein the maleic acid copolymer is a copolymer of maleic anhydride and a (meth)acrylate.

6. The coating agent according to claim 2, wherein the maleic acid copolymer is a copolymer of 10 to 50 mole % of maleic anhydride and 90 to 50 mole % of said alkenyl aromatic compound.

7. The coating agent according to claim 1, wherein the basic substance is selected from the group consisting of ammonia and one or a mixture of two or more water-soluble amines selected from the group consisting of (poly)alkylamine, (poly)ethyleneimine and (poly)vinylimidazole.

8. The coating agent according to claim 1, wherein the basic substance is ammonia.

9. The coating agent according to claim 1, wherein the solvent is one or more selected from water, alcohols, cellosolves, furanol and dioxane.

10. The coating agent according to claim 1, wherein the solvent is water or water containing one or more selected from alcohols, cellosolves, furanol and dioxane.

11. The coating agent of claim 1 wherein the basic substance is trimethylamine, ethanolamine (poly)allylamine, (poly)ethyleneimine or (poly)vinylimidazole.

12. The coating agent of claim 1 wherein the basic substance is said alkylamine or alkanolamine.

13. The coating agent of claim 1 wherein the basic substance is a water soluble and readily volatile amine.

14. The coating agent of claim 11 wherein the basic substance is trimethyl amine.

15. The coating agent of claim 11 wherein the basic substance is ethanolamine.

16. The coating agent of claim 11 wherein the basic substance is (poly)allylamine, (poly)ethyleneimine or (poly)vinylimidazole.

* * * * *